US010107830B2

(12) United States Patent
Wygant et al.

(10) Patent No.: US 10,107,830 B2
(45) Date of Patent: Oct. 23, 2018

(54) METHOD OF FORMING CAPACITIVE MEMS SENSOR DEVICES

(71) Applicant: Texas Instruments Incorporated, Dallas, TX (US)

(72) Inventors: Ira Oaktree Wygant, Palo Alto, CA (US); Peter B. Johnson, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 330 days.

(21) Appl. No.: 15/148,086

(22) Filed: May 6, 2016

(65) Prior Publication Data

US 2016/0363609 A1  Dec. 15, 2016

Related U.S. Application Data

(63) Continuation of application No. 13/779,160, filed on Feb. 27, 2013, now Pat. No. 9,470,710.

(51) Int. Cl.
*B81C 1/00* (2006.01)
*G01P 15/125* (2006.01)
(Continued)

(52) U.S. Cl.
CPC .......... *G01P 15/125* (2013.01); *B81B 7/007* (2013.01); *B81C 1/00301* (2013.01);
(Continued)

(58) Field of Classification Search
CPC .......... B81B 7/007; B81B 2201/0271; B81B 2203/0127; B81B 2207/096;
(Continued)

(56) References Cited

U.S. PATENT DOCUMENTS 4,889,832 A   12/1989  Chatterjee
6,312,581 B1  11/2001  Bruce et al.
(Continued)

FOREIGN PATENT DOCUMENTS

CN   1298110 A    6/2001
CN   101223633 A  7/2008
(Continued)

OTHER PUBLICATIONS

PCT Notification of Transmittal of the International Search Report and the Written Opinion of the International Searching Authority, or the Declaration. dated Jun. 10, 2014.
(Continued)

*Primary Examiner* — Carl Arbes
(74) *Attorney, Agent, or Firm* — Rose Alyssa Keagy; Charles A. Brill; Frank D. Cimino

(57) ABSTRACT

A method of forming a capacitive micro-electro-mechanical system (MEMS) sensor device includes at least one capacitive MEMS sensor element with at least one capacitive MEMS sensor cell. A patterned dielectric layer including a thick dielectric region and a thin dielectric region is formed on a top side of a first substrate. A second substrate is bonded to the thick dielectric region to provide at least one sealed micro-electro-mechanical system (MEMS) cavity. The second substrate is thinned to reduce a thickness of said second substrate to provide a membrane layer. Vias are etched through the membrane layer and said thick dielectric region extending into the first substrate to form embedded vias. A dielectric liner which lines the embedded vias is formed within the first substrate. The embedded vias are filed with electrically conductive TSV filler material to form a plurality of through-substrate vias (TSVs), said plurality of TSVs extending to at least a top of said membrane layer. A patterned metal cap layer including metal caps is formed on
(Continued)

top of said plurality of TSVs. Trenches are etched through regions of the membrane layer for releasing a first portion of the membrane layer over said MEMS cavity to provide a MEMS electrode and to define a fixed electrode. A third substrate including an inner cavity and outer protruding portions framing said inner cavity is bonded to the thick dielectric. The protruding portions are bonded to the thick dielectric region and, together with said first substrate vacuum, seals said MEMS electrode. The plurality of TSVs on a bottom side of said first substrate are exposed.

11 Claims, 8 Drawing Sheets

(51) Int. Cl.
   H04R 19/00 (2006.01)
   H02N 1/00 (2006.01)
   B81B 7/00 (2006.01)
   H03H 3/007 (2006.01)
   H03H 9/24 (2006.01)
   H03H 9/10 (2006.01)

(52) U.S. Cl.
   CPC .......... *H02N 1/006* (2013.01); *H03H 3/0072* (2013.01); *H03H 9/2468* (2013.01); *H03H 9/2489* (2013.01); *H04R 19/005* (2013.01); *B81B 2201/0271* (2013.01); *B81B 2203/0127* (2013.01); *B81B 2207/096* (2013.01); *B81C 2201/013* (2013.01); *B81C 2203/0109* (2013.01); *B81C 2203/0118* (2013.01); *B81C 2203/036* (2013.01); *H03H 9/1057* (2013.01); *Y10T 29/49165* (2015.01)

(58) Field of Classification Search
   CPC .......... B81C 1/00301; B81C 2201/013; B81C 2203/0109; B81C 2203/0118; B81C 2203/036; G01P 15/125; H02N 1/006; H03H 3/0072; H03H 9/1057; H03H 9/2468; H04R 19/005; Y10T 29/49165
   See application file for complete search history.

(56) References Cited

U.S. PATENT DOCUMENTS

| | | | |
|---|---|---|---|
| 6,384,353 B1* | 5/2002 | Huang | B81B 7/007 200/181 |
| 6,528,344 B2* | 3/2003 | Kang | B81B 7/0077 257/E21.499 |
| 6,828,656 B2 | 12/2004 | Forbes et al. | |
| 7,098,117 B2* | 8/2006 | Najafi | B81B 7/0006 438/456 |
| 7,393,758 B2* | 7/2008 | Sridhar | B81C 1/00301 257/684 |
| 7,553,764 B2* | 6/2009 | MacNamara | B81C 1/00301 257/774 |
| 7,576,426 B2* | 8/2009 | Gan | B81C 1/00269 257/710 |
| 7,799,678 B2 | 9/2010 | Kropewnicki et al. | |
| 8,143,704 B2 | 3/2012 | West | |
| 8,324,006 B1 | 12/2012 | Adler et al. | |
| 8,563,345 B2 | 10/2013 | Adler | |
| 8,957,504 B2 | 2/2015 | Chao-Yuan et al. | |
| 2004/0077117 A1 | 4/2004 | Ding | |
| 2005/0082682 A1 | 4/2005 | Liu | |
| 2007/0215964 A1 | 9/2007 | Khuri-Yakub et al. | |
| 2008/0194053 A1 | 8/2008 | Huang | |
| 2008/0203556 A1 | 8/2008 | Huang | |
| 2009/0140357 A1 | 1/2009 | Kupnik et al. | |
| 2009/0085191 A1 | 4/2009 | Najafi | |
| 2011/0071397 A1 | 3/2011 | Wodnicki et al. | |
| 2011/0187000 A1 | 8/2011 | West | |
| 2011/0242932 A1 | 10/2011 | Lebental et al. | |
| 2012/0068302 A1 | 3/2012 | Beirke et al. | |
| 2012/0182557 A1 | 7/2012 | Kilic et al. | |
| 2012/0187508 A1 | 7/2012 | Adler et al. | |
| 2014/0239768 A1 | 8/2014 | Johnson et al. | |
| 2014/0239769 A1 | 8/2014 | Johnson et al. | |

FOREIGN PATENT DOCUMENTS

| | | |
|---|---|---|
| CN | 101578686 A | 11/2009 |
| CN | 102318041 A | 1/2012 |
| DE | 102005058977 | 6/2007 |
| EP | 1796025 | 11/2006 |
| RU | 2398195 C1 | 8/2010 |
| RU | 2408857 C1 | 1/2011 |
| RU | 2463570 C1 | 10/2012 |
| WO | 2007036922 | 4/2007 |
| WO | 2010032156 A2 | 3/2010 |

OTHER PUBLICATIONS

RU 2408857—English Machine Translation, (Gusudarstvennoe Obrazovatelnoe Uchrezhdenie Vysshego Professionalnogo Obrazovaniya "Penzensky Gosudarstvenny Universitet"(PGU)).
RU 2463570—English Machine Translation, (Otkrytoe Aktsionernoe Obschestvo Nauchno-Issledovatelsky Institut Fizicheskikh Izmereny).
RU 2398195—English Machine Translation, (Belozubov Evgeny Mikhailovich et al.).
PCT Notification of Transmittal of the International Search Report and the Written Opinion of the International Searching Authority, or the Declaration; dated Jun. 5, 2014.
Kuefeng Zhuang, et al., "Wafer-Bonded 2-D CMUT Arrays Incorporating Through-Wafer Trench-Isolated Interconnects with a Supporting Frame," IEEE Transactions on Ultrasonics, Ferroelectrics and Frequency Control, vol. 56, No. 1, pp. 182-192, Jan. 2009.
PCT Notice of Transmittal of the International Search Report and the Written Opinion of the International Searching Authority, or the Declaration dated Jul. 16, 2014.
"Fabrication of 3D Integrated heterogeneous Systems," IMAPS Nordic, TØnsberg, Norway, Sep. 14-15, 2009.
European Search Report: dated Nov. 7, 2016.
The State Intellectual Property Office of PRC Search Report, dated Dec. 2, 2016.
State Intellectual Property Office of PRC, Notification of Second Office Action and Search Report, Document Series No. 2017081001470540, 4 pages, dated Aug. 15, 2017.

* cited by examiner

METHOD OF FORMING CAPACITIVE MEMS SENSOR DEVICES

CROSS-REFERENCE TO RELATED APPLICATIONS

This application is a Divisional of and claims benefit to U.S. patent application Ser. No. 13/779,160, filed Feb. 27, 2013. This application is also related to U.S. patent application Ser. No. 13/779,376, filed Feb. 27, 2013 and U.S. patent application Ser. No. 13/779,210, filed Feb. 27, 2013—U.S. Pat. No. 9,351,081—a Divisional of which was filed on Apr. 11, 2016 assigned U.S. patent application Ser. No. 15/095,264. Said application are herein incorporated by reference in their entireties.

FIELD

Disclosed embodiments relate to methods of forming capacitive micro-electro-mechanical system (MEMS) sensor devices and MEMS sensor devices therefrom.

BACKGROUND

Known MEMS processes have challenges with producing cost effective small size packaged MEMS sensor devices, as well as defining a robust integration scheme incorporating conventional release layers. In addition, after conventional release the MEMS sensor cell(s) in the MEMS sensor device needs to be vacuum sealed at a low pressure to provide desired high-Q sensor performance which provides further challenges.

SUMMARY

Disclosed embodiments describe solutions to the problems with conventional capacitive micro-electro-mechanical system (MEMS) sensor devices resulting from the use of release layers to seal the MEMS cavity of the sensor cell(s) by adding through-substrate vias (TSVs) (e.g., through-silicon vias in the case of silicon substrates). The TSVs provide access to the fixed electrode and released MEMS electrode both from the bottom side of the MEMS sensor device. The MEMS cavity of each sensing cell is sealed, such as by vacuum diffusion bonding, to another substrate (e.g., wafer) referred to as a third "capping" substrate over the fully released MEMS electrode(s) of the capacitive MEMS sensor device, which eliminates the need for a conventional passivation layer. At the end of the process the completed capacitive MEMS sensor device will itself provide a package.

BRIEF DESCRIPTION OF THE DRAWINGS

Reference will now be made to the accompanying drawings, which are not necessarily drawn to scale, wherein.

DETAILED DESCRIPTION

Figure 1A:
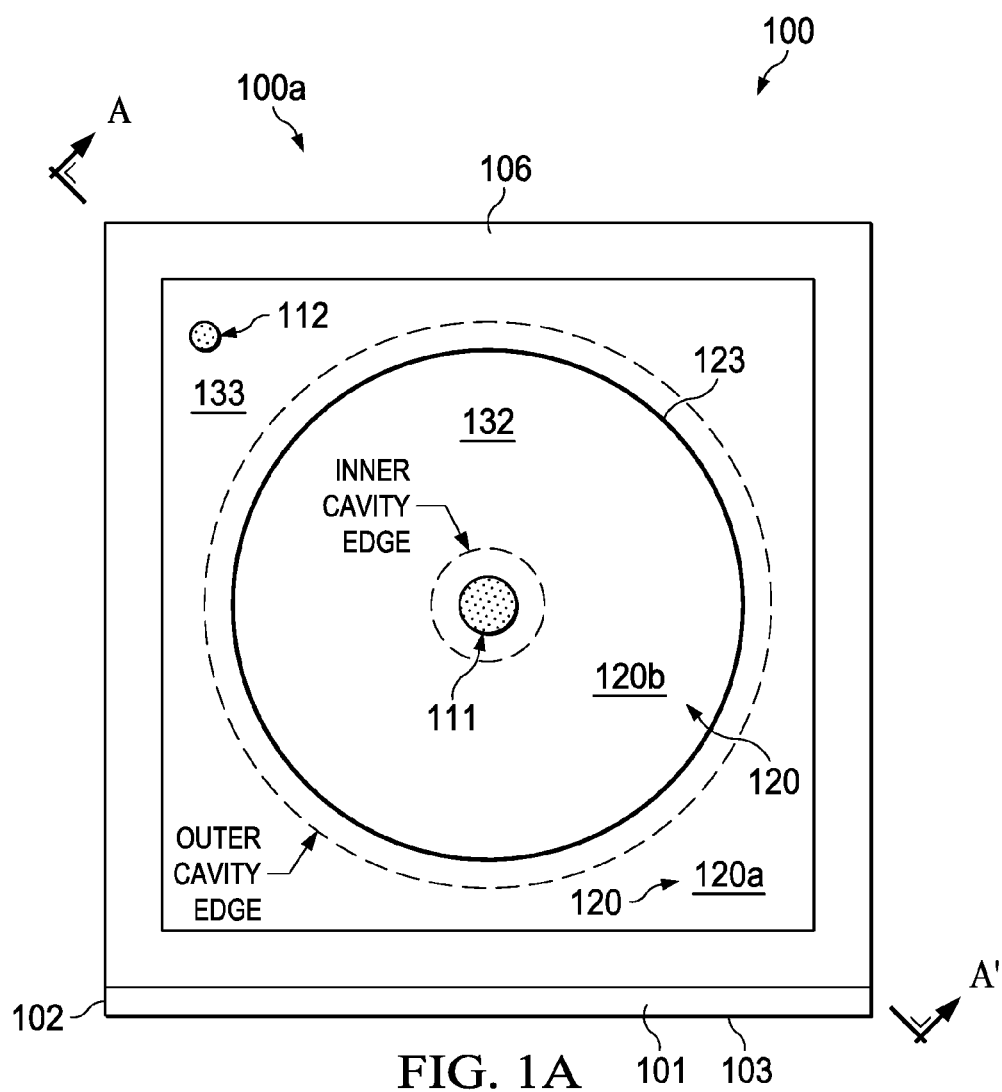
FIG. 1A is a top view depiction an example capacitive MEMS device shown as a capacitive MEMS element with a single capacitive MEMs sensor cell, with the third capping substrate removed to show underlying features according to an example embodiment, along with a cut line for the cross sectional depictions described below.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Regarding nomenclature used herein, the smallest capacitive MEMS sensor entity is a capacitive MEMS sensor cell. Multiple capacitive MEMS sensor cells can be connected in parallel, such as on the die using an electrically common MEMS electrode 120b (typically by a membrane layer 120 with metal on top) to form a capacitive MEMS sensor element. A capacitive MEMS sensor element can have any number (≥1) of capacitive MEMS sensor cells. Typically, the more capacitive MEMS sensor cells in an element the greater the output that element can generate responsive to a given stimulus. A capacitive MEMS sensor array (device/die) can have any number of capacitive MEMS sensor cell elements. One of the electrodes (e.g., top) of the respective CMUT elements can be electrically isolated from the other electrodes (e.g., top) of the other CMUT elements to allow each CMUT element to be connected independently to allow individual addressability. For example, as described herein, the electrically common MEMS electrodes 120b for each capacitive MEMS sensor element can be addressed by a single TSV.

FIG. 1A is a top view depiction an example packaged capacitive MEMS sensor device (die) 100 shown as a capacitive MEMS element with a single capacitive MEMS sensor cell 100a, shown as a disk resonator, according to an example embodiment. The third capping substrate described below is depicted removed or transparent to show underlying features. A cut line A-A' is shown which is used for some cross sectional depictions described below, including the cross sectional depictions shown in FIG. 1B. Although circular feature geometries are shown (a disk) for the capacitive MEMS sensor cell 100a in FIGS. 1A and 1B, other feature geometries may be used such as rectangular.

Figure 1B:
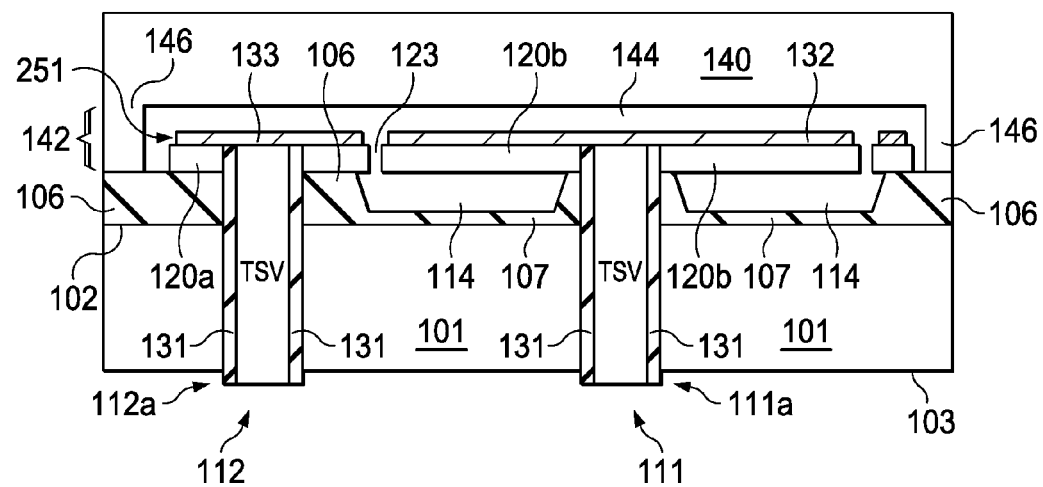
FIG. 1B is a cross sectional depiction of an example capacitive MEMS device/element/cell shown in FIG. 1A along the cut line A-A' shown.

The capacitive MEMS sensor device 100/cell 100a includes a first substrate 101 having a top side 102 including a patterned dielectric layer thereon, including as shown in FIG. 1B thick dielectric regions 106 and thin dielectric regions 107 which form the bottom surface of the MEMS cavity 114. Capacitive MEMS sensor cell 100a includes a plurality TSVs including at least a first TSV 111 and a second TSV 112, which as shown in FIG. 1B are exposed on a bottom side 103 of the first substrate 101 and extend a full thickness of the first substrate 101. First TSV 111 and a second TSV 112 are shown including protruding TSV tips 111a and 112a, respectively. The TSVs 111 and 112 include a TSV dielectric liner 131.

Capacitive MEMS sensor cell 100a includes a second substrate providing a membrane layer 120 which is on the thick dielectric regions 106 and over the thin dielectric regions 107. The membrane layer as used herein refers to a semiconductor layer (e.g., silicon) that is defined to form the fixed electrode 120a and MEMS electrode 120b for the capacitive MEMS sensor cell 100a, and can optionally also provide interconnect lines (typically having a metal layer thereon) between the MEMS electrodes 120b of respective MEMS sensor cells within capacitive MEMS sensor elements of capacitive MEMS sensor devices having a plurality of MEMS sensor elements. The membrane layer 120 need not include any integrated circuit elements (e.g., transistors).

The membrane layer 120 includes a fixed portion providing a fixed electrode 120a, and includes enclosing through-holes 123 which release the membrane layer 120 over the MEMS cavity 114 to provide a movable MEMS electrode 120b which functions as a resonating element for the capacitive MEMS sensor cell 100a. The plurality of TSVs also extend a full thickness of the membrane layer 120 including the first TSV 111 which extends through a top side of the MEMS electrode 120b and the second TSV 112 which extends through a top of the fixed electrode 120a. A patterned metal layer 251 including a metal cap 132 is on a top of the first TSV 111 and another metal cap 133 is over the second TSV 112.

As shown in FIG. 1B, packaged capacitive MEMS sensor device 100/capacitive MEMS sensor cell 100a includes a third capping substrate 140 which functions as a cap to seal the MEMS electrode 120b, having a bottom side 142 including a recessed inner cavity 144 and outer protruding portions 146 which frame the inner cavity 144. The third capping substrate 140 is bonded with its bottom side 142 down with the protruding portions 146 bonded (e.g., diffusion vacuum bonded) to the thick dielectric region 106 as shown. The final cavity for the capacitive MEMS sensor cell 100a is thus defined by the third capping substrate 140 and the first substrate 101 (e.g., by 2 wafers during fabrication). The third capping substrate 140 together with the first substrate 101 can vacuum seal the MEMS electrode 120b so that third capping substrate 140 completes the packaged capacitive MEMS sensor device 100.

Figure 1C:
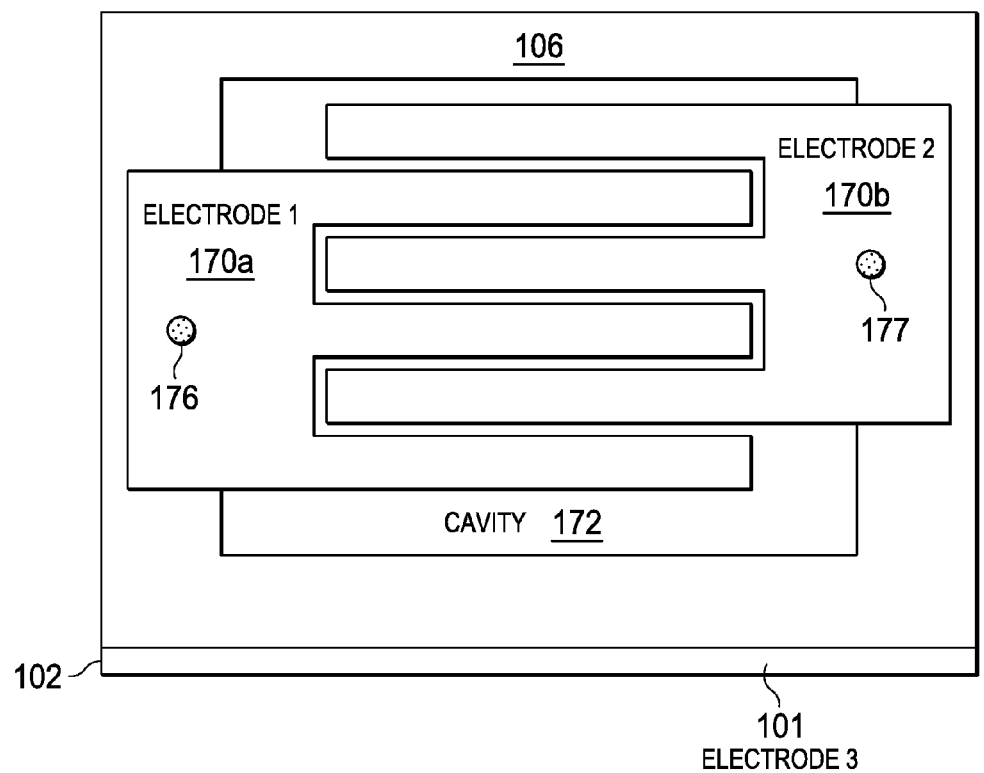
FIG. 1C is a top view depiction of an example capacitive MEMS device shown as a capacitive MEMS element with a tuning fork resonator cell with the third capping substrate removed to show underlying features, according to an example embodiment.

FIG. 1C is a top view depiction of an example packaged capacitive MEMS sensor device 180 shown as a capacitive MEMS element with a tuning fork resonator capacitive sensor cell 180a with the third capping substrate 140 again removed to show underlying features, according to an example embodiment. The packaged capacitive MEMS sensor device 180/tuning fork resonator capacitive sensing cell 170a includes a MEMS cavity 172 and three (3) electrodes shown as electrode 1 (170a), electrode 2 (170b), 170a and 170b being multi-finger electrodes, and electrodes 3 (for first substrate 101), where the MEMS cavity 172 is a lateral cavity located between the outer edges of electrode 1 (170a) and electrode 2 (170b), while electrode 3 is provided by the first substrate 101. Analogous to packaged capacitive MEMS device/cell 100 shown in FIGS. 1A and 1B, TSV 176 and TSV 177 extend through a top side of their respective electrodes, electrode 1 (170a) and electrode 2 (170b), respectively.

A third electrode (electrode 3) is not always needed for disclosed packaged capacitive MEMS sensor devices. If the capacitive MEMS device is a 2D motion sensor only, the connections provided by two TSV is sufficient for sensor operation. A low resistivity first substrate 101 can be used as a third electrode for devices such as the packaged capacitive MEMS sensor device 180/tuning fork resonator capacitive sensor cell 180a to enable 3D motion detection. For the capacitive MEMS device 100 shown in FIG. 1A and FIG. 1B, a third electrode allows rocking motion or vertical deflection of the MEMS electrode 120b (e.g., a Si disk) to be detected as a change in capacitance between the MEMS electrode 120b and the low resistivity first substrate 101. One can also detect a capacitance change between the first substrate 101 and the underside of electrode 1 (170a), and electrode 2 (170b). An up or down motion would cause the fingers of electrode 1 (170a) and electrode 2 (170b) to flex in a vertical direction.

Figure 1D:
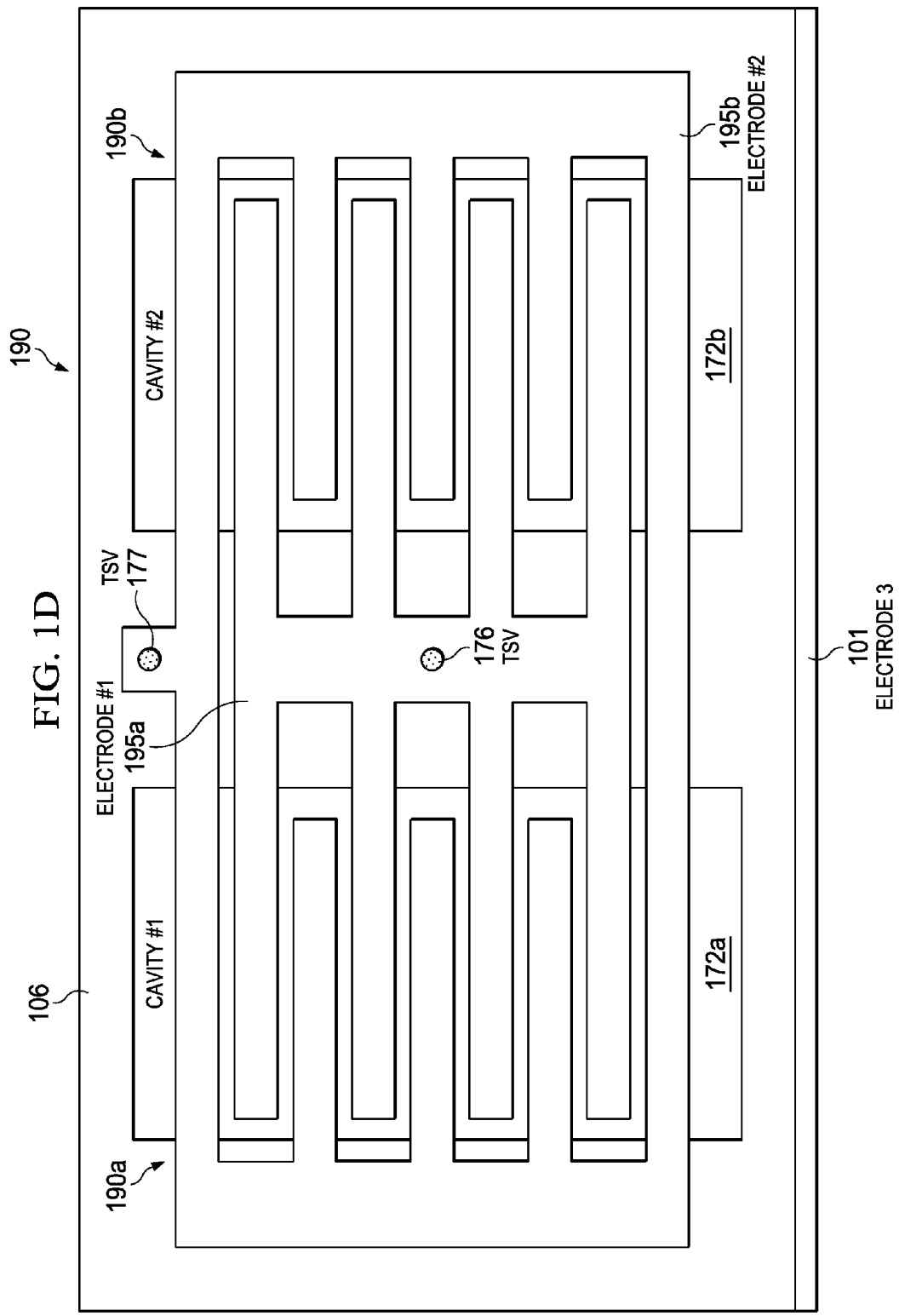
FIG. 1D is a top view depiction of an example capacitive MEMS device shown as a two cell capacitive MEMS element with a tuning fork resonator cell with the third capping substrate removed to show underlying features, according to an example embodiment.

FIG. 1D is a top view depiction of an example capacitive MEMS device 190 shown as a two cell capacitive MEMS element (comprising cells 190a and 190b) having a tuning fork resonator cell configuration with the third capping substrate 140 removed to show underlying features, according to an example embodiment. The tuning fork resonator capacitive sensing cells 190a and 190b each include their own MEMS cavity 172a and 172b. Capacitive MEMS device 190 has three (3) electrodes shown as electrode 1 (195a), electrode 2 (195b), 195a and 195b being multi-finger electrodes, with optional electrode 3 (from first substrate 101). Electrodes 195a and 195b comprise the membrane layer 120 which may have an optional metal thereon (for low resistance) which couple together the electrodes 195a and 195b for cells 190a and 190b. Analogous to packaged capacitive MEMS device/cell 100 shown in FIGS. 1A-B and MEMS device/cell 180 shown in FIG. 1C, TSV 176 and TSV 177 extend through a top side of their respective electrodes, electrode 1 (195a) and electrode 2 (195b), respectively. Third capping substrate 140 if shown would have its outer protruding portions 146 aligned with the perimeter of thick dielectric region 106 (perimeter of capacitive MEMS device 190), with a recessed inner cavity within.

FIGS. 2A-2H are cross-sectional diagrams showing processing progression for an example method of forming capacitive MEMS devices during different stages of fabrication, according to an example embodiment. Although the capacitive MEMS device is described being formed as a capacitive MEMS element with a single capacitive MEMS sensor cell, disclosed capacitive MEMS devices may be formed having a plurality of interconnected capacitive MEMS elements each having a plurality of capacitive MEMS cells (see FIG. 3 described below).

The embodiment described as shown in FIGS. 2A-H is thus for illustration only and is one particular embodiment which describes formation of a packaged MEMS sensor device having a capacitive MEMS element with a single capacitive MEMS cell 100a. Other techniques for forming disclosed capacitive MEMS devices can be used without departing from the scope of this disclosure, including forming capacitive MEMS sensor devices including a plurality of disclosed capacitive MEMS sensor elements each having a plurality of capacitive MEMS sensor cells. Several sensor elements in parallel can be used to achieve a given frequency over a given area. One can connect the sensor elements in parallel to reduce the impedance (for driving) or connect them in series to increase the impedance (for sensing). One can drive/sense sensor elements differentially to improve common mode signals or mitigate manufacturing asymmetries.

Thick dielectric regions 106, such as comprising a silicon oxide layer, is provided on a top surface 102 of a first substrate 101. First substrate 101 can generally comprise any substrate material, including silicon-based substrates, or other substrates. As disclosed above, for 3D motion detection MEMS sensor embodiments, the first substrate 101 can be a low resistivity bulk silicon substrate (e.g., resistivity ≤0.1 Ω-cm such as about 0.01 Ω-cm), which as described above enables the first substrate 101 to be used as practical (low series resistance) third electrode for the MEMS sensor cell(s).

In one particular embodiment, to form thick dielectric regions 106 a thick silicon oxide layer is grown to a thickness of 4.5 μm to 5.5 μm using a high pressure oxidation (HiPOx) process. The use of HiPOx facilitates the rapid growth of thick thermal oxide layers and provides excellent thickness control of typically less than 1%. One particular example set of HiPOx process conditions are temperature of 1000° C. at 25 atmospheres pressure in steam for 9.5 hours on virgin first substrates 101 (e.g., silicon wafers), and the alignment marks for photolithography are etched later in the process. However, as an alternative, thick dielectric regions 106 may also comprise conventional thermally grown silicon oxide, or a deposited dielectric layer, including silicon oxide or other dielectric material.

The substrate vendor's laser scribe generally present can be used to ensure a minimum of surface contamination or roughness. Masking and etching of front side alignment marks can follow. Resist strip and a pre-clean process can help ensure a smooth surface for the thick dielectric regions 106 used later in the process for facilitating subsequent wafer bonding of the third capping substrate thereto.

A first masking level "CELLETCH" uses thick photoresist in order to support the subsequent etch through the thick dielectric regions 106 (e.g., thick silicon oxide layer) to initially begin to define at least one etched capacitive MEMS sensor cell for each device/die. A plasma etch which is non-polymerizing can be used for etching a first portion of the thick dielectric region 106, such as to etch about 4.65 μm of silicon oxide when thick dielectric regions 106 comprise silicon oxide and have a thickness of about 5 μm to 5.3 μm. A sidewall slope of ~80° is generally desirable and can be achieved from the natural resist erosion. The remaining portion of the thick dielectric region 106 (e.g., 0.5 μm silicon oxide) after plasma etch can be removed by wet etch that provides etch selectivity relative to the substrate material (e.g., Si) to avoid damaging the top surface 102 of the first substrate 101.

About 50% of the top surface 102 of the first substrate 101 (e.g., a wafer) will generally be open (exposed) during the etch of the thick dielectric region. The resist is then stripped (e.g., a wet strip process). Following an appropriate pre-oxidation clean, in an oxidation step a thin (e.g., 0.3 μm) sensor cell oxide and post oxide can be grown. For effective subsequent bonding of the third capping substrate 140 described below, the post oxide surface roughness should generally be less than about 3 Å.

Figure 2A:
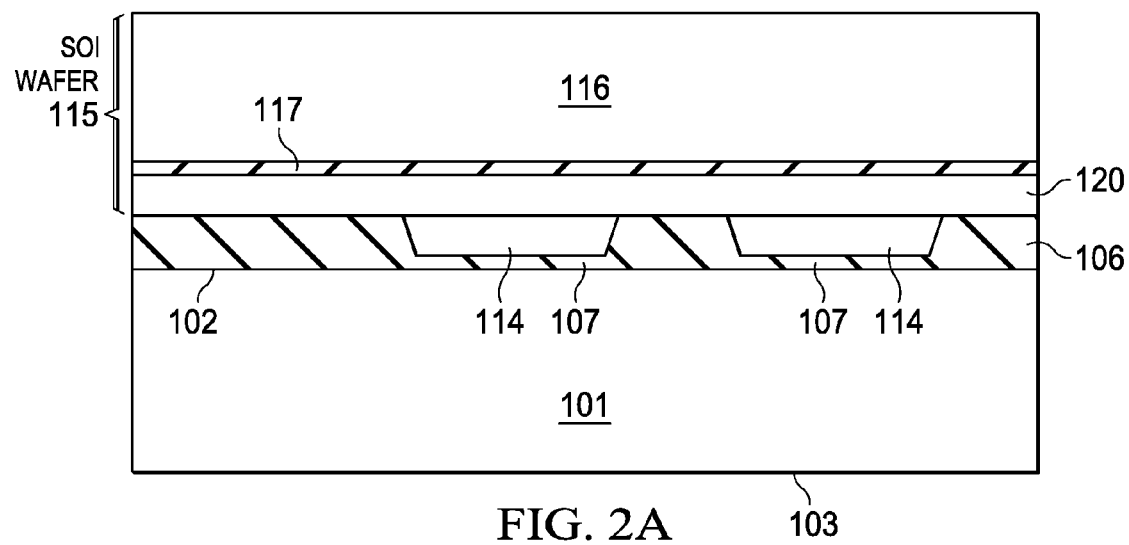
FIGS. 2A-H are cross-sectional diagrams showing processing progression for an example method of forming a capacitive MEMS sensor device, according to an example embodiment.

FIG. 2A shows a cross sectional depiction after bonding (e.g., vacuum fusion bonding) of a second substrate shown as a SOI wafer 115 having a handle (wafer) 116, a buried dielectric layer (generally referred to in the art as a "buried oxide layer" or "(BOX) layer") 117 and membrane layer 120 (e.g., generally referred to in the art as an "active layer") to the thick dielectric region 106 of the first substrate 101. In one particular embodiment the handle comprise silicon and is 500 μm to 750 μm thick, the membrane layer 120 is 15 μm±0.5 μm (e.g., about 14 μm) thick, and the buried dielectric layer 117 is 1.0 μm to 2.0 μm thick. The membrane layer 120 is bonded to the thick dielectric regions 106 of the first substrate 101.

The handle 116 represents any suitable semiconductor wafer formed from any suitable material(s), such as undoped or lightly-doped (n or p-doped) silicon. The buried dielectric layer 117 represents any suitable layer(s) of electrically insulative material(s), such as a silicon oxide layer. The membrane layer 120 represents any suitable layer(s) of substrate material(s), for example, moderately-doped silicon, such as having a resistivity of about 5 to 10 Ω-cm. For interconnection purposes between cells or elements, the membrane layer 120 can include a metal layer thereon which renders the pathway provided a low resistivity pathway.

For embodiments where the capacitive MEMS sensor device includes a plurality of MEMS sensor die, the membrane layer 120 can be heavily doped and/or include a metal layer thereon to permit low resistance connections between sensor cells in multi-cell capacitive MEMS elements to be made by connection provided at least in part by the membrane layer 120 (see FIG. 1D described above). For example, membrane layer 120 can have a resistivity of ≤0.1 Ω-cm, such as about 0.01 Ω-cm. In other embodiments, the membrane layer 120 can have a resistivity of up to about 100 Ω-cm. Proper known bonding procedures including cleans and plasma pre-treatments can be used.

The bonding can comprise vacuum fusion wafer bonding. For vacuum fusion wafer bonding, as is commonly known in the art, attributes which ensure good wafer bonding include the bonding surfaces being smooth with a surface roughness typically less than 3 Å. Grown thermal oxide and silicon substrates generally satisfy this requirement. Prior to bonding the surfaces can be treated with an RCA clean (SC-1, where SC stands for Standard Clean, with a 1:1:5 solution of $NH_4OH$ (ammonium hydroxide)+$H_2O_2$ (hydrogen peroxide)+$H_2O$ (water) at 75 or 80° C. typically for 10 minutes. The second RCA clean step is a short immersion in a 1:50 solution of HF+$H_2O$ at 25° C., in order to remove the thin oxide layer and some fraction of ionic contaminants. The third and last step RCA clean (called SC-2) is performed with a 1:1:6 solution of HCl+$H_2O_2$+$H_2O$ at 75 or 80° C. This treatment effectively removes the remaining traces of metallic (ionic) contaminants. A $N_2$ plasma activation and a DI water rinse can follow. The vacuum bonding is typically performed at a pressure less than $8 \times 10^5$ mbar. As a final step the bonded surfaces are annealed in $N_2$ for several hours, such a 4 hour 1050° C. $N_2$ anneal.

The handle 116 is then removed after bonding, such as by backgrinding the handle 116 to about a 150 μm post-backgrind target, performing a second 4 hour 1050° C. anneal after backgrinding prior to a wet etch of the handle remaining after backgrind, and then wet etching the remaining handle. The handle remaining after backgrind when the handle 116 comprises silicon can be etched in a wet silicon etch, such as using a hydroxide (e.g., KOH or TMAH), stopping on the buried dielectric layer 117. Mask and etching plates from membrane layer 120 can be used to form at least one MEMS electrode 120b over the alignment marks to reopen the alignment marks and enable proper alignment for subsequent process steps. Since the membrane layer 120 is generally a relatively thick layer for etching (e.g., about 14 μm thick), a Bosch etch can compensate for resist erosion during the etch of the membrane layer 120. As known in the art, the Bosch process, also known as pulsed or timemultiplexed etching, alternates repeatedly between two modes/phases to achieve nearly vertical etched structures.

However, in the fabrication method, the SOI wafer 115 can be replaced by a alternative second substrate such as a standard bulk silicon substrate to reduce cost, where the standard substrate material can be bonded to the thick dielectric region 106 on the first substrate 101. In this alternate embodiment, after bonding, the second substrate material can be thinned by backgrind and polishing to the desired target membrane thickness, such as 14 µm±5 µm thick.

Figure 2B:
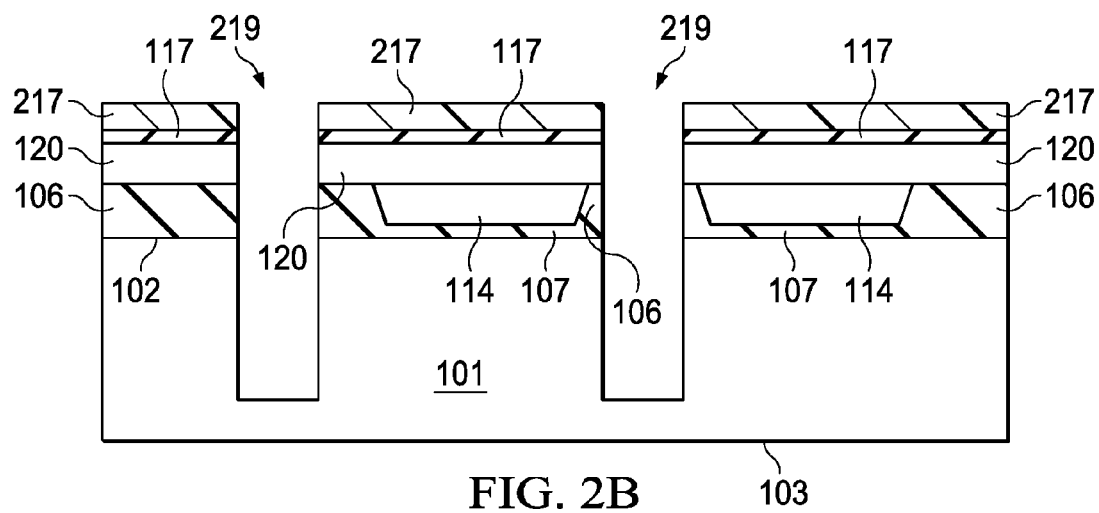

FIG. 2B shows a cross sectional depiction after the mask level "TSVHOLE" (Mask #2) and formation of a TSV holes to form embedded vias 219 beginning from the top side of the membrane layer 120. Embedded vias 219 in one particular embodiment can be 30 µm in diameter and 150 µm deep. The resist 217 should be thick enough to support etching through the stack (e.g., 1.1 µm buried dielectric layer 117 plus 14 µm membrane layer 120 plus 5.15 µm thick dielectric layer 106 plus 130 µm thick first (e.g., silicon) substrate 101, to blind etch the embedded vias referred 219 which can also be referred to as to as TSV holes. Separate etch tools may be used for the oxide and Bosch silicon etches.

The resist 217 is then stripped and a TSV dielectric liner 131 (e.g. a dielectric oxide 0.5 µm thick) is deposited or is thermally grown within the embedded vias 219. A diffusion barrier metal layer can be formed and added onto on the TSV dielectric liner 131 to frame the TSVs and protect against escape of the subsequently deposited TSV filler material (167, see FIG. 2C) into the semiconductor (e.g., silicon) in the case of highly mobile metal TSV filler materials, such as copper. For example, in one particular embodiment, following formation of the dielectric liner 131, a 0.0875 µm Ta/TaN diffusion barrier metal layer then a 1.5 µm Cu seed layer 233 (see FIG. 2C) is deposited for copper filled TSV embodiments. The seed layer 233 can, for example, represent a copper and titanium seed layer.

A Mask "CUMOLD" (Mask #3) can exclude copper (or other metal) plating over the MEMS sensor cell(s) of each MEMS sensor device. Negative resist can be used to ensure the TSVs are resist-free after masking. The mask can be helpful since the MEMS electrode 120b (e.g. a Si plate) may be deflected by several microns and the subsequent copper chemical mechanical polishing (CMP) step in the case of copper filled TSVs may not fully remove the copper over the MEMS sensor cells.

Figure 2C:
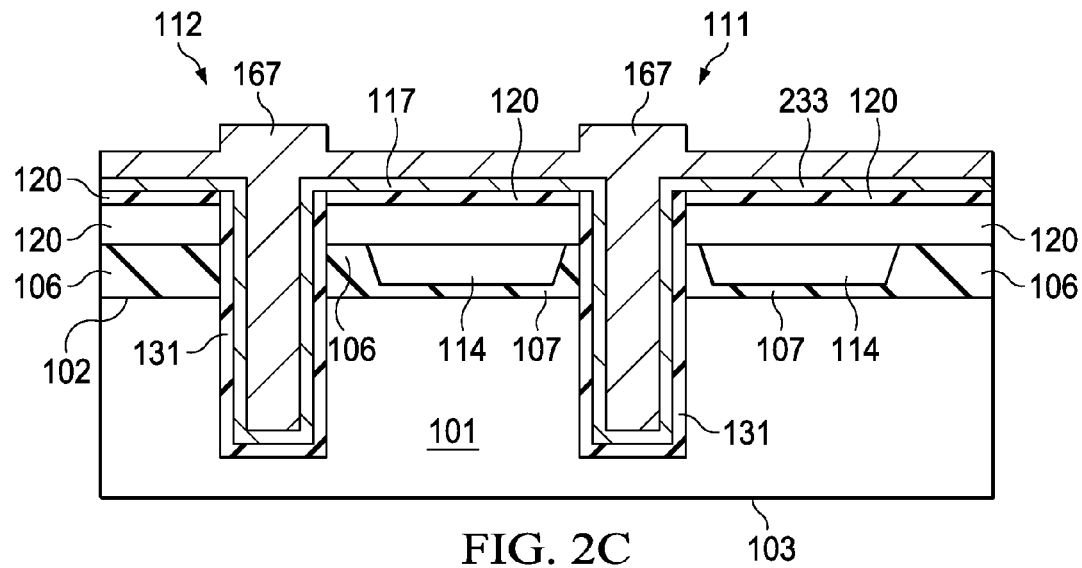

FIG. 2C shows a cross sectional depiction after electroplating a metal such as copper (e.g., ~15 µm thick) to provide a TSV filler material 167 onto a seed layer 233 (a Cu seed layer for Cu) to fill the embedded vias/TSV holes 219 lined with dielectric liner 131 and a diffusion barrier metal layer and resist strip to form TSVs 112 and 111 having TSV filler material 167 therein. Although the dielectric liner 131 is shown along the full length of the TSVs 111 and 112 including on the thick dielectric region 106, in the case of a thermally formed dielectric liner 131 (e.g., silicon oxide), as opposed to a deposited dielectric liner 131, the dielectric liner 131 will not grow on the thick dielectric region 106 and thus not be on the thick dielectric region 106. The diffusion barrier metal layer (e.g., for copper TSV filler material 167) is not shown for simplicity. A TSV Cu CMP process can be used to remove the copper (or other TSV filler material) "nail heads" over the TSVs 112, 111 and lateral to the nail heads. A TSV filler material anneal can follow.

A second TSV copper CMP can be used to remove all the remaining copper and diffusion barrier metal layer (e.g., Ta/TaN). A wet strip may be used to clear residue over the sensor cell. The dielectric liner 131 along with the buried dielectric layer 117 stopping on the MEMS electrode 120b (e.g. a Si plate) are then removed.

Figure 2D:
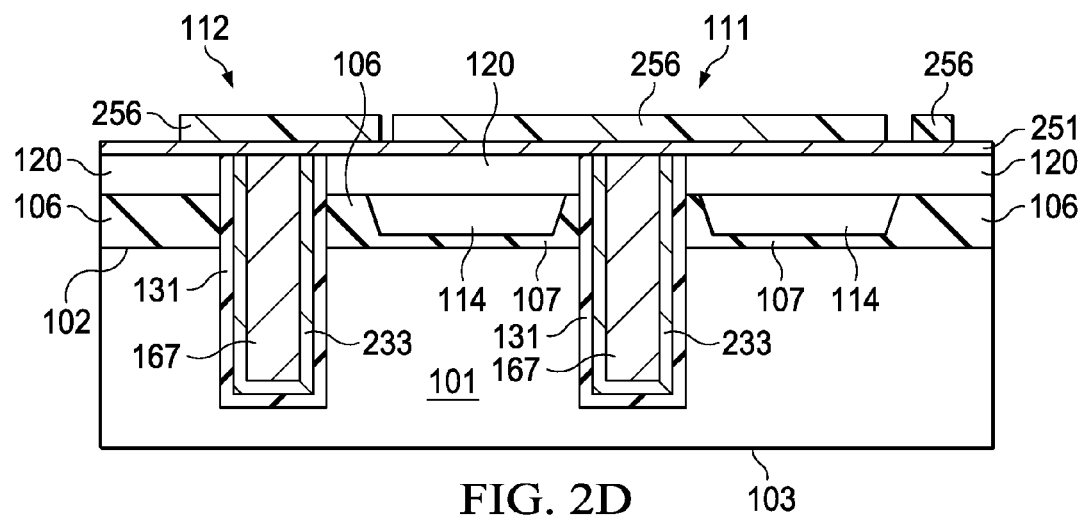

FIG. 2D shows a cross sectional depiction after depositing metal layer 251, such as 0.5 µm AlCu. This metal layer 251 will provide the MEMS electrode (e.g., Si plate) 120b metallization thereon and connect to the TSV structures. A mask level "ALTOP" (Mask #4) having resist 256 shown in FIG. 2D is used to define the metal layer 251 over the capacitive MEMS sensing cells. The ALTOP critical dimensions (CDs) can be 1 µm/side smaller than the final MEMS electrode 120b (e.g. a Si plate) dimension. Patterning the metal layer 251 before patterning the membrane layer 120 to form the MEMS electrode 120b (e.g. a Si plate) helps avoid both the metal layer 251 and resist step coverage issues. A wet etch can be used to etch the metal layer 251 from the field area. The resist 256 is then stripped.

Figure 2E:
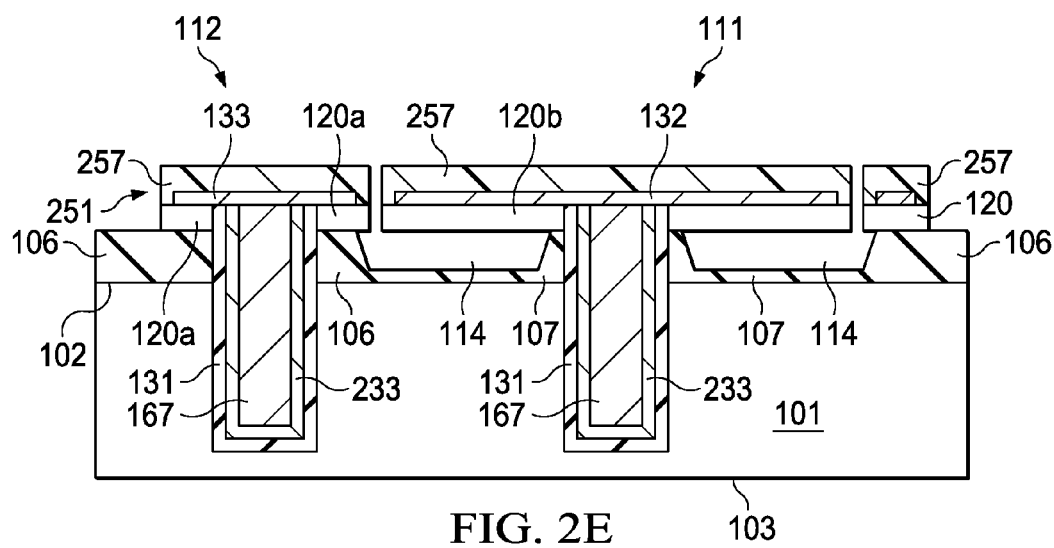

FIG. 2E shows a cross sectional depiction after a mask level "PLATESI" (Mask #5) uses a resist pattern 257 to completely encapsulate the patterned metal layer 251. The plate mask can be about 1 µm/side larger than the metal layer 251 (ALTOP) mask. The depiction in FIG. 2E is after etching the membrane layer 120 to form the MEMS electrode 120b (e.g. a Si plate) and to separate the capacitive MEMS sensor cells for capacitive MEMS sensor devices having a plurality of capacitive MEMS sensor cells. Regarding separation, assuming the size of a capacitive MEMS sensor cell is defined as the dimension of the inner cavity 144 of the third (capping) substrate 140, the capacitive MEMS sensor cells in adjacent capacitive MEMS sensor elements can be separated by the etching of the membrane layer 120 by a distance of 30 µm to 70 µm (typically at least 5 µm), for example, to ensure robust wafer bonding with good vacuum integrity. The etch of the membrane layer 120 generally stops on the thick dielectric layer 106 as shown and also etches through the membrane layer 120 to form the MEMS electrode 120b (e.g. a Si plate) releasing the MEMS electrode 120b which functions as an oscillator. A Bosch etch can be used with a short cycle to minimize side wall scalloping. The etch should not generally be reentrant. All of the metal layer 251 will be covered with resist during this operation.

The resist pattern 257 is then stripped. A final alloy at 400° C. in $N_2+H_2$ for 30 minutes can then be performed.

Figure 2F:
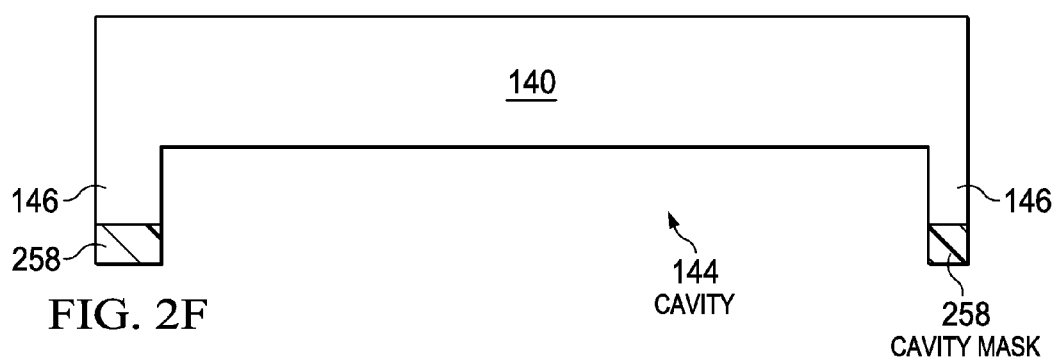

FIG. 2F shows a cross sectional depiction after the mask level "cavity" (Mask #6) including resist pattern (cavity mask) 258 which can be applied to a third capping substrate (e.g., wafer) 140, and used to vacuum cap each capacitive MEMS sensing cell. This masking level will define a unique cavity for each capacitive MEMS sensing cell for each MEMS device/die on the MEMS wafer. The inner cavities 144 in the third capping substrate (e.g., wafer) 140 can be 20 µm deep etched cavities in one particular embodiment to form a cavity wafer 280 having inner cavity 144 and outer protruding portions 146. A Bosch etch can be used for the cavity etch. After the cavity etch the resist pattern 258 can be wet stripped to ensure a clean surface for wafer bonding.

Figure 2G:
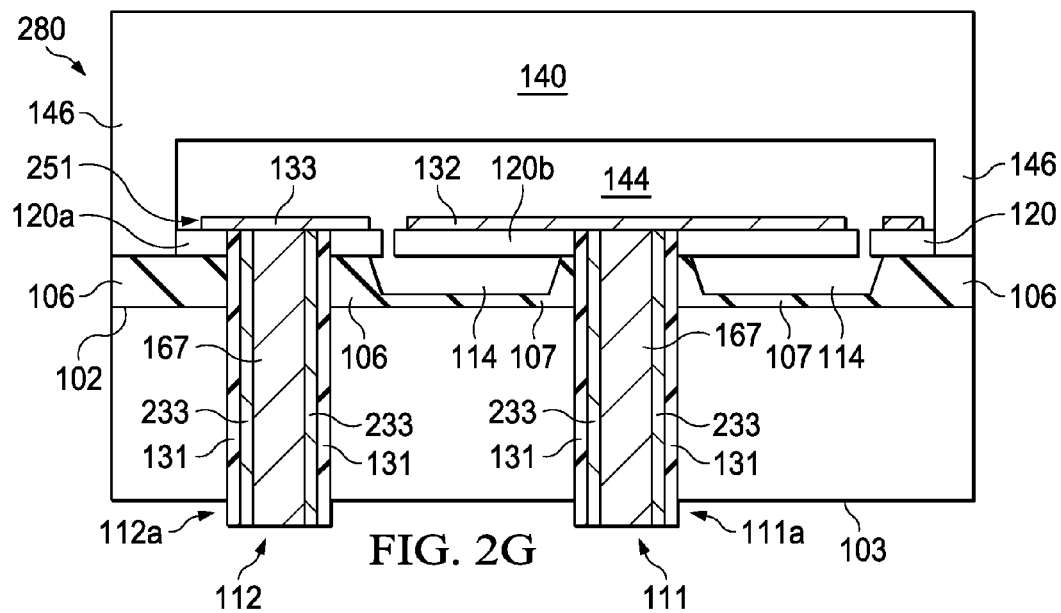

FIG. 2G shows a cross sectional depiction after vacuum bonding the MEMS wafer stack (first substrate 101 with membrane layer 120 thereon including fixed electrode 120a and MEMS electrode 120b, with TSVs 111, 112) to the cavity wafer 280, followed by exposing the tips 111a and 112a of TSVs 111, 112, respectively. In the case of vacuum bonding, after vacuum bonding the resulting MEMS sensor cell(s) 100a have their own vacuum sealed cavity including an upper vacuum cavity provided by inner cavity 144 and MEMS cavity 114. A 4 hour 400° C. anneal can be used for the vacuum bonding. Backgrinding can be used to thin the first substrate 101 from the bottom side 103 to almost reach the embedded TSVs.

In one embodiment, the backgrind can remove all backside films and about 550 µm of the first substrate 101 leaving about 175 µm. Etching the first substrate (e.g., Si) 101 to expose the tips 111a and 112a of the TSVs 111, 112 can leave about 100 µm of the first substrate 101 (e.g., Si). One can utilize a XeF plasma etch or wet Si etch. The dielectric liner 131 (e.g., a silicon oxide liner) and the barrier metal layer (if present) are then etched from the tips 111a and 112a of the TSVs 111 and 112. A plasma etch of the dielectric liner 131 and barrier metal will leave dielectric (e.g., oxide) spacers on the sidewalls of the TSVs 111 and 112.

The resulting bonded wafer having vacuum bonded cavity wafer 280 (e.g., third capping substrate (e.g., wafer) 140 725 µm thick with inner cavities 144) on the MEMS wafer stack can then be diced which directly provides packaged capacitive MEMS sensor devices/die. Optional back side metal can be a process step which enables contacts to the bottom side 103 of the first substrate 101 to utilize the first substrate 101 as an electrode for embodiments having a third electrode, such as 3-D sensing applications as described above. The backside metal flow can replace the dielectric liner 131 and barrier metal etch processes.

For backside metal processing, backside metal layer 259 is deposited, such as 1000 Å Ti+2800 Å Ni+1500 Å Ag in one particular embodiment. The bottom side 103 of the first substrate 101 should be clean before deposition. A presputter etch of about 300 Å can be used for cleaning the surface. A mask level "TSVEXP" (Mask #7) can be used protect the backside metal layer 259 while it is stripped from the tips 111a and 112a of the TSVs 111 and 112.

The backside metal flow can begin after the TSV tip exposure process step. The backside metal layer 259 (e.g., TiNiAg) is etched from the tips of the TSVs 111 and 112. The dielectric liner 131 and the barrier metal layer (for copper filled TSVs) are then etched from the tips of the TSVs 111 and 112. A plasma etch of the dielectric liner 131 and barrier metal will leave dielectric (e.g., oxide) spacers on the sidewalls of the TSVs 111 and 112. The resist is then stripped.

Figure 2H:
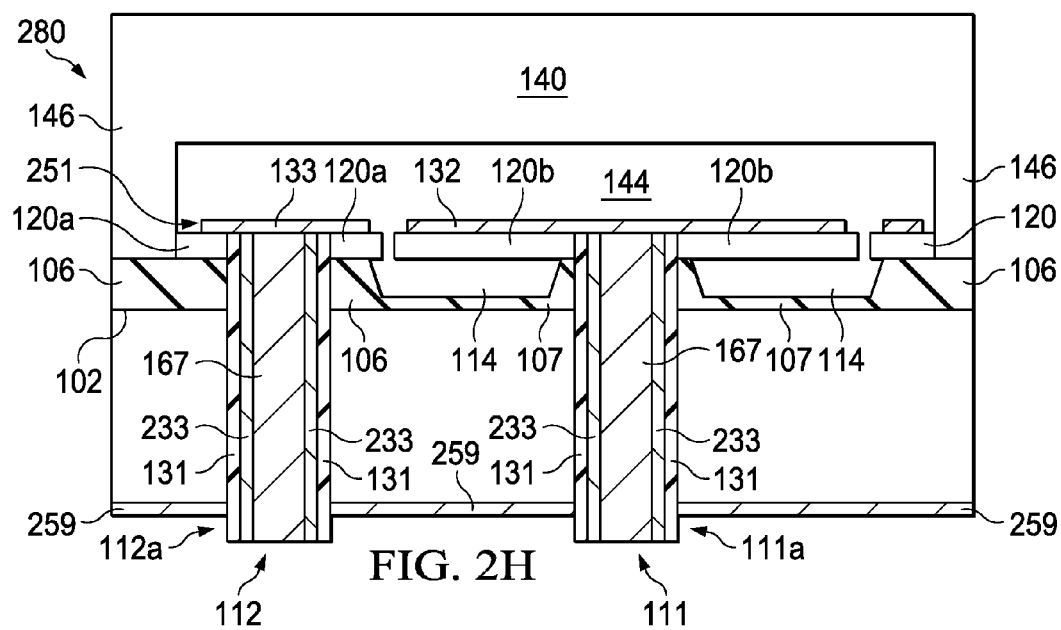

FIG. 2H shows a cross sectional depiction after optional backside metal 259 pattern formation. The resulting bonded wafer having a vacuum bonded cavity wafer 280 (e.g., 725 µm thick third capping substrate (e.g., wafer) 140 with inner cavities 144) on the MEMS wafer stack having a backside metal layer 259 can then be diced which directly provides packaged capacitive MEMS sensor devices/die.

Figure 3:
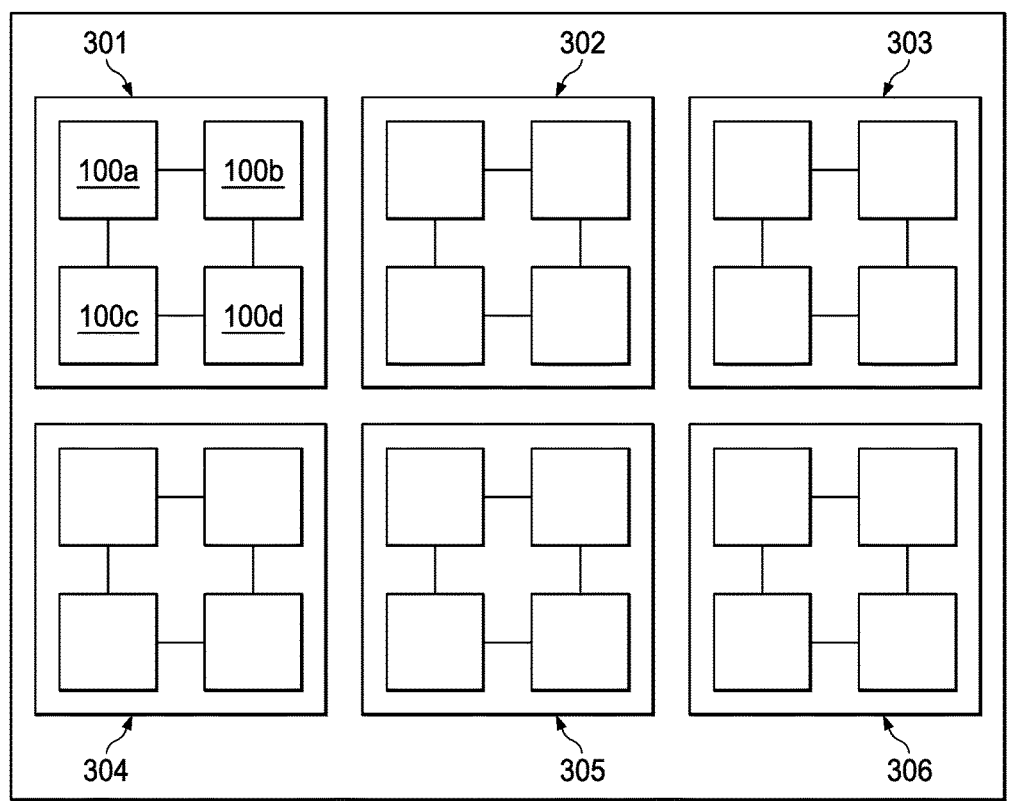
FIG. 3 is a top view depiction an example capacitive MEMS device including a plurality of capacitive MEMS elements, each capacitive MEMS element including a plurality of the MEMS cell shown in FIGS. 1A and 1B coupled together within each element, according to an example embodiment.

FIG. 3 is a top view depiction an example capacitive MEMS sensor device (die) 300 including a plurality of capacitive MEMS sensor elements 301-306, with each capacitive MEMS sensor element including four of the capacitive MEMS sensor cells shown in FIGS. 1A and 1B shown as 100a-100d coupled together, according to an example embodiment. Although the capacitive MEMS sensor device 300 is shown having six capacitive MEMS sensor elements each having four capacitive MEMS sensor cells 100a-100d, disclosed capacitive MEMS sensor devices can have any number of capacitive MEMS sensor elements, and each capacitive MEMS sensor element can have any number of capacitive MEMS sensor cells. As described above, the top electrodes can be separate for the capacitive MEMS sensor elements 301-306 allowing separate addressing of the respective elements using a single TSV for each element. The respective capacitive MEMS sensor elements can be driven/sensed differentially to improve common mode signals or mitigate manufacturing asymmetries.

In a typical sensing operation, a dc bias voltage is applied to one or more MEMS electrodes 120b through TSV 111. The TSV 112 can be referenced to ground. The mechanical movement of the MEMS electrode 120b is detected capacitively between TSV 111 and TSV 112. Standard biasing circuits can be used to DC couple the bias voltage between the fixed electrode 120a and MEMS electrode 120b and AC couple the sensing or driving signal thereto. If the first substrate 101 is not part of the signal path for capacitive detection, there is generally no need for a low resistivity (e.g., 0.01 Ω-cm) first substrate 101.

It is noted generally all thicknesses and dimensions can be adjusted to fit specific applications. There are also a variety of alternate embodiments. For example, the protruding TSV tips for the TSVs are optional. Substantially flush TSV tips can be used with a redirect layer (RDL) for connecting the TSVs to pads lateral to the TSVs. The RDL layer can be formed on a dielectric film on the bottom side 103 of the first substrate 101 (e.g., a silicon wafer). If the TSV tips are flush with surface of the bottom side 103 (e.g., Si), they would be slightly recessed after a thin oxide (e.g., ~5,000 Å thick) was deposited and patterned to re-expose the TSVs.

Disclose embodiments provide several significant advantages. By including TSVs and sealing the fully released MEMS structures with a bonded cap (e.g., vacuum fusion bonded cap), there is no need to use a sacrificial release layer or seal release holes with a plasma deposited capping layer. In addition, the MEMS electrode 120b for resonating is formed from a single crystal material (e.g., single crystal silicon). Disclosed embodiments enable small die and packages along with reduced cost since the capacitive MEMS sensor device/die provides its own package.

SOI defined structures, such as the membrane layer 120 for forming the MEMS electrodes 120b generally have good thickness uniformity for device matching for sensor array arrangements, and provide very good matching for resonators, filters, etc. Disclosed fusion bonding provides a superior hermetic seal and better vacuum as compared to the seal obtained from conventional release layers. The third capping substrate being generally a thick wafer (e.g., a thick Si wafer) will provide good mechanical isolation.

Disclosed embodiments can be used to form semiconductor die that may integrated into a variety of assembly flows to form a variety of different devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A method of forming a capacitive micro-electro-mechanical system (MEMS) sensor device including at least one capacitive MEMS sensor element with at least one capacitive MEMS sensor cell, comprising:

forming a patterned dielectric layer including a thick dielectric region and a thin dielectric region on a top side of a first substrate;

bonding a second substrate to said thick dielectric region to provide at least one sealed micro-electro-mechanical system (MEMS) cavity;

thinning said second substrate to reduce a thickness of said second substrate to provide a membrane layer;

etching vias through said membrane layer and said thick dielectric region extending into said first substrate to form embedded vias;

forming a dielectric liner which lines said embedded vias within said first substrate;

filling said embedded vias with electrically conductive TSV filler material to form a plurality of through-substrate vias (TSVs), said plurality of TSVs extending to at least a top of said membrane layer;

forming a patterned metal cap layer including metal caps on a top of said plurality of TSVs;

etching trenches through regions of said membrane layer for releasing a first portion of said membrane layer over said MEMS cavity to provide a MEMS electrode and to define a fixed electrode;

bonding a third substrate including an inner cavity and outer protruding portions framing said inner cavity, wherein said protruding portions bond to said thick dielectric region and together with said first substrate vacuum seals said MEMS electrode, and exposing said plurality of TSVs on a bottom side of said first substrate.

2. The method of claim 1, wherein said bonding said second substrate comprises bonding said membrane layer of a semiconductor on insulator (SOI) substrate having a handle opposite said membrane layer and a buried dielectric layer in between said handle and said membrane layer; and said thinning said second substrate comprises removing said handle, further comprising removing said buried dielectric layer said filling said embedded vias.

3. The method of claim 1, wherein said bonding said second substrate and said bonding said third substrate both comprise vacuum fusion bonding.

4. The method of claim 1, wherein said forming a patterned dielectric layer comprises a high pressure oxidation (HiPOx) growth process.

5. The method of claim 1, wherein said third substrate comprises a silicon wafer.

6. The method of claim 1, wherein said TSV filler material comprises copper, further comprising forming protruding TSV tips for said plurality of TSVs that protrude from said bottom side of said first substrate.

7. The method of claim 1, wherein said first substrate has a resistivity less than or equal to (≤)0.1 Ω-cm, further comprising a patterned metal layer on a bottom side of said first substrate, wherein said first substrate provides a third electrode for said capacitive MEMS sensor cell to enable 3 dimensional (3D) capacitive sensing for said capacitive MEMS sensor device.

8. The method of claim 1, wherein said capacitive MEMS sensor device includes a plurality of said capacitive MEMS sensor elements, wherein each of said plurality of capacitive MEMS sensor elements include a plurality of said capacitive MEMS sensor cells, and wherein said capacitive MEMS sensor elements are individually addressable by contacting one of said plurality of TSVs.

9. The method of claim 8, wherein each of said plurality of capacitive MEMS sensor cells in each of said plurality of capacitive MEMS sensor elements are connected in parallel by said membrane layer which couples together said MEMS electrodes.

10. A method of forming a capacitive micro-electro-mechanical system (MEMS) sensor device including at least one capacitive MEMS element with at least one capacitive MEMS sensor, comprising:

forming a patterned dielectric layer including a thick dielectric region and a thin dielectric region on a top side of a first substrate;

bonding a membrane layer of a semiconductor on insulator (SOI) substrate having a handle opposite said membrane layer and a buried dielectric layer in between said handle and said membrane layer to said thick dielectric region to provide said MEMS cavity;

removing said handle of said SOI substrate;

etching vias through said membrane layer and said thick dielectric region extending into said first substrate to form embedded vias;

forming a dielectric liner which lines said embedded vias within said substrate;

filling said embedded vias with electrically conductive TSV filler material to form a plurality of through-substrate vias (TSVs), said plurality of TSVs extending to at least a top of said membrane layer;

forming a patterned metal cap layer including metal caps on a top of said plurality of TSVs, etching trenches through regions of said membrane layer for releasing a first portion of said membrane layer over said MEMS cavity to provide a MEMS electrode and to define a fixed electrode;

bonding a third substrate including an inner cavity and outer protruding portions framing said inner cavity, wherein said protruding portions bond to said thick dielectric region and together with said first substrate vacuum seals said MEMS electrode, and exposing said plurality of TSVs on a bottom side of said first substrate.

11. The method of claim 10, wherein said bonding said membrane layer and said bonding said third substrate both comprise vacuum fusion bonding.

* * * * *

UNITED STATES PATENT AND TRADEMARK OFFICE
CERTIFICATE OF CORRECTION

| | | |
|---|---|---|
| PATENT NO. | : 10,107,830 B2 | Page 1 of 1 |
| APPLICATION NO. | : 15/148086 | |
| DATED | : October 23, 2018 | |
| INVENTOR(S) | : Ira Oaktree Wygant and Peter B. Johnson | |

It is certified that error appears in the above-identified patent and that said Letters Patent is hereby corrected as shown below:

On the Title Page

Item (63):
"Continuation" should instead be --Division--

Signed and Sealed this
Eleventh Day of December, 2018

Andrei Iancu
*Director of the United States Patent and Trademark Office*